United States Patent [19]

Hildebrand

[11] Patent Number: 5,473,214
[45] Date of Patent: Dec. 5, 1995

[54] LOW VOLTAGE BENDER PIEZO-ACTUATORS

[75] Inventor: Stephen Hildebrand, Arlington, Va.

[73] Assignee: Noise Cancellation Technologies, Inc., Linthicum, Md.

[21] Appl. No.: 57,944

[22] Filed: May 7, 1993

[51] Int. Cl.$^6$ .................................................. H01L 41/08
[52] U.S. Cl. ........................ 310/321; 310/316; 310/328; 310/330; 310/326
[58] Field of Search .................................. 310/316, 317, 310/319, 311, 328, 800, 330–332, 326, 327; 381/71; 248/638; 181/150, 400

[56] References Cited

U.S. PATENT DOCUMENTS

| | | | |
|---|---|---|---|
| 2,776,020 | 1/1957 | Conover | 181/31 |
| 2,776,294 | of/1957 | Conover | 310/328 X |
| 4,048,454 | 9/1977 | Barcus et al. | 310/330 |
| 4,158,787 | 6/1979 | Forward | 310/51 |
| 4,283,461 | 8/1981 | Wooden et al. | 310/800 X |
| 4,352,039 | 9/1982 | Hagood et al. | 310/328 |
| 4,352,961 | 10/1982 | Kumada et al. | 179/110 A |
| 4,363,991 | 12/1982 | Edelman | 310/316 |
| 4,565,940 | 1/1986 | Hubbard, Jr. | 310/326 |
| 4,626,730 | 2/1986 | Hubbard, Jr. | 310/326 |
| 4,835,747 | 5/1989 | Billet | 310/800 X |
| 4,849,668 | 7/1989 | Crawley et al. | 310/328 |
| 4,878,188 | 10/1989 | Ziegler, Jr. | 364/724.01 |
| 4,940,914 | 7/1990 | Mizuno et al. | 310/326 |
| 4,980,597 | 12/1990 | Iwao | 310/319 |
| 5,032,753 | 7/1991 | Yamaguchi et al. | 310/317 |
| 5,091,953 | 2/1992 | Tretter | 381/71 |
| 5,105,377 | 4/1992 | Ziegler, Jr. | 364/724.01 |
| 5,130,948 | 7/1992 | Laukien et al. | 310/328 X |

OTHER PUBLICATIONS

O. L. Angevine, "Active Cancellation of the Hum of Large Electric Transformers," *Proceedings of Inter–Noise*, Jul. 20–22, 1992.

C. Liang, S. Fanping, C. Rogers, "Dynamic Output Characteristics of Piezo Electric Actuators," *Proceedings of Smart Structures and Materials*, Feb. 1993.

S. J. Kim & J. D. Jones, "Optimal Design of Piezo Actuators for Active Noise and Vibration Control," AIAA 13th Aeroacoustics Conference, Oct. 1990.

*Primary Examiner*—Mark O. Budd
*Attorney, Agent, or Firm*—James W. Hiney

[57] ABSTRACT

A low voltage bender piezo-actuator with multiple, same size piezo layers (11, 12) separated by thin electrically conductive strips (14) and adapted to be affixed to a rigid, vibration transmitting plate (10) to produce noise counter vibrations to prevent noise from passing through the plate.

13 Claims, 2 Drawing Sheets

LOW VOLTAGE BENDER PIEZO-ACTUATORS

This invention relates to low voltage bender piezo-actuators adapted to be used with active panels and enclosures although other uses are feasible.

BACKGROUND

Building a high-transmission-loss enclosure around a distributed noise source is a method of reducing the sound radiated from the source. For these enclosures to be effective at low frequencies, active control is often preferable to strictly passive means due to the increased size, weight or cost of passive methods effective against frequencies.

Often noise sources are surrounded by an "enclosure" that is inherent to the noise source. One example is a power transformer. In this case, the transformer core is placed in a tank filled with oil. The transformer core causes the outside surfaces of the tank to vibrate and radiate acoustic energy. Thus the outside surfaces of the tank are the noise source. These tanks are large. For example, the tank for a small transformer (e.g., 7.5 MVA) may be about 8 ft. wide, 4 ft. deep and 10 ft. tall. Some large transformers are rated for a few hundred MVA and are many times larger than those dimensions. Active control of noise radiating from transformer tanks has been attempted by many people for decades. See for example Conover (U.S. Pat. No. 2,776,020), or more recently O. L. Angevine as described in "Active Cancellation of the Hum of Large Electric Transformers", *Proceedings of Inter-Noise*, Jul. 20–22, 1992. These prior attempts have been able to decrease noise levels for only a narrow angle radiating from the transformer. One reason for their inability to obtain global noise reduction stems from their inability to "couple tightly" to the noise source. By "couple tightly" it is meant that the anti-noise sources closely match the location, distribution and levels of the noise sources. One way to improve the source coupling is to use low profile acoustic sources; for example, thin panels driven by piezos. In this case thin, large-area piezo ceramic patches operating in the $d_{31}$ mode (i.e., piezoceramics apply a moment-load to the panel) are attached directly to the surface. If these low-profile sources are attached closely to the structure and the noise source is not overly complex in its distribution, then large global reductions are achievable. However, designing and building many linear, high-level, low-frequency sources can be prohibitively expensive for complicated noise sources.

A preferable method of solving the coupling problem is to place piezo-ceramic patches directly on the surface of the panel or enclosure. One patch is placed at the peak of each half wavelength for those acoustically-radiating structural modes which have resonant frequencies near the excitation frequency(s). This ensures optimal coupling as far as location and distribution of the actuators. However, obtaining adequate actuator output level is more difficult. This requires optimizing the piezo-actuator design, and performing impedance matching between the actuator and panel or enclosure.

Performing impedance matching between the piezo-actuator and the panel or enclosure can be difficult. Early research has established the optimal piezo thickness for the case of static deformation. For example, using simple static models, S. J. Kim and J. D. Jones (1990) showed that the piezo thickness for maximum actuator output for steel panels is about one-half the thickness of the steel panel to which it is attached. This is described in "Optimal Design of Piezo-actuators for Active Noise and Vibration Control", AIAA 13th Aeroacoustics Conference, October 1990. Increasing the piezo thickness beyond the optimal thickness actually decreases the effective actuator output. Current research is focusing on the optimal piezo thickness for the dynamic case as, for example, C. Liang, S. Fanping and C. Rogers, "Dynamic Output Characteristics of piezoelectric Actuators", *Proceedings of Smart Structures and Materials*, February 1993. Since most of this research has focused on aerospace applications, the panels have been thin and lightweight with low damping. In this case, impedance matching is straightforward since the piezoceramics are typically thin (e.g., 0.010 inch thick or less). An audio-amplifier can be used with a step-down audio-transformer run "backwards" (i.e., with the secondary side wired to the amplifier). Using this approach, peak voltages of only about 200 volts are required. Power requirements can be reduced further by adding an inductor in series or parallel with the piezo or using other components such that the circuit is driven in resonance. This piezo thickness (0.010 inch thick or less) can be attached to aluminum panels up to about 0.025 inch thick maximum, or to steel panels up to about 0.020 inch thick maximum with good mechanical impedance matching (according to static impedance matching methods). However, there are many industrial applications with thick, rigid panels or enclosures where the above approach will not work. For example, transformer tanks are typically 0.375 inch thick. This is 18 times thicker than the above approach would "allow".

Thus the above approach for electromechanical impedance matching is of little use for piezo-driven panels for industrial applications. For example, as stated above, transformer tanks are typically fabricated with 0.375 inch thick steel plate. This would imply an optimal piezo thickness of about 0.190 inch thick. The piezos can be driven continuously with up to 10 volts peak for every 0.001 inch of thickness. This would imply a drive voltage of 1890 volts peak. Amplifiers for such devices cost about $2000 per channel for large quantities of amplifier channels. Active control of the transformer tank may require up to 100 actuators, particularly for large transformers with high-order harmonics in their noise signature. This implies an amplifier cost of several hundred thousand dollars. This is the price of a passive solution for transformer noise: building a concrete bunker around the transformer, which has been used in Canada and Europe. Thus, in spite of the advantages of close coupling (location and distribution), applying thick piezos directly to the tank is not a practical solution with existing technology due to limitations with actuator level and high amplifier cost.

OBJECTS OF THE INVENTION

The object of this invention is to provide a means of attaching optimally sized piezoceramic patches directly to the side of thick, rigid enclosures without the need for expensive, high-voltage amplifiers. This is achieved by making the piezo into thin "wafers" and gluing or fusing the wafers together. Preferably, the wafers are stacked such that adjoining layers are poled in opposite directions. This eliminates the need to insert electrical insulators between the layers, which decreases actuator output and increases cost. The optimal piezo thickness discussed above is therefore achieved by building up a sandwich of thin layers of oppositely poled piezoceramics, each with large area. The appropriate lower-level voltage is applied across each thin layer of piezoceramic. The effective voltage drop across the full thickness of the actuator may be several kilovolts. A sensor such as an accelerometer would typically be included as an additional fused layer.

The above noted object as well as other objects will become apparent when reference is had to the accompanying drawings in which, FIG. 1 is a perspective view of a test panel with a piezo patch, FIG. 2 is an exploded cross-sectional view of a two layer piezoceramic patch showing ceramic polarity with the accompanying wiring diagram, FIG. 3 is a side view of an assembled cross-section of the two layer piezoceramic patch of FIG. 2, and FIG. 4 is a cross-sectional view of a partially assembled multi-layer piezoceramic patch.

DETAILED DESCRIPTION OF THE INVENTION

The use of stacked piezo devices is not new. Since the 1940's the U.S. Navy has glued together thick, piezoceramics with small cross-sectional areas (which were driven in the longitudinal or $d_{33}$ mode) in order to increase the longitudinal peak displacement of the actuator. These are typically referred to as "piezoceramic stacks". The displacement of the whole stack assembly is equal to the sum of the individual piezos.

Companies have developed methods of integrally firing multiple thin layers of both the ceramics and the conductors. This has decreased the cost of the stack while decreasing voltage requirements by allowing thin layers.

Note that these piezo stacks typically cannot be used for active enclosures because they need something rigid to push against. That "something rigid to push against" is a mechanical ground, which is seldom available for actual applications. There are two exceptions. One is the use of inertial shakers which push against a mass. However, there may not be sufficient space for an inertial device, particularly for low frequency cancellation which requires a large mass. The second exception is when the structural modes in opposite sides of active enclosures are moving in phase (i.e., one side moving away from center while the opposite side is also moving away from center). Connecting opposite sides of an enclosure together with devices containing piezoceramic stacks may then be used to stop motion of the sides of the enclosure. However, attaching opposite sides of an enclosure together will not work in many applications. For most active panels or enclosures it is preferable to use piezo patches (i.e., multimorphs in the bending mode).

The piezoelectric means are controlled by electronic controllers operating as described in U.S. Pat. Nos. 4,878, 188 to Ziegler, 5,105,377 to Ziegler and/or 5,091,953 to Tretter which are hereby incorporated by reference herein.

Figure 1:
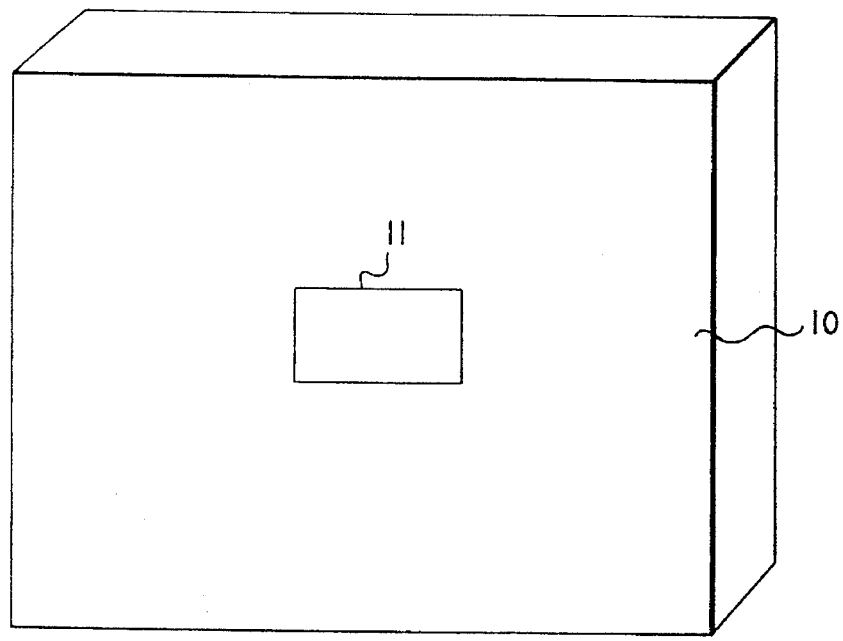

A test was performed to demonstrate the utility of the layered piezo patches and the configuration is shown in FIG. 1. The test device was a ⅛ inch thick by 10 inch square aluminum plate, 10, with ⅛ by ¾ inch aluminum welded perpendicular to the edges. The plate was simply supported. Initially a single, 0.020 inch thick piezoceramic patch, 11, was attached to the plate. See FIG. 1.

A modal test was then performed to determine the resonant frequency for the (1,1) mode for the plate with the single piezo patch. It was determined that the (1,1) mode for the plate was 274 Hz. A 274 Hz, 20.0 volts peak signal was then applied to the piezo. This resulted in an acceleration of 143 m/s$^2$ as measured by a 1.3 gram accelerometer mounted at the center of the plate.

Figure 2:
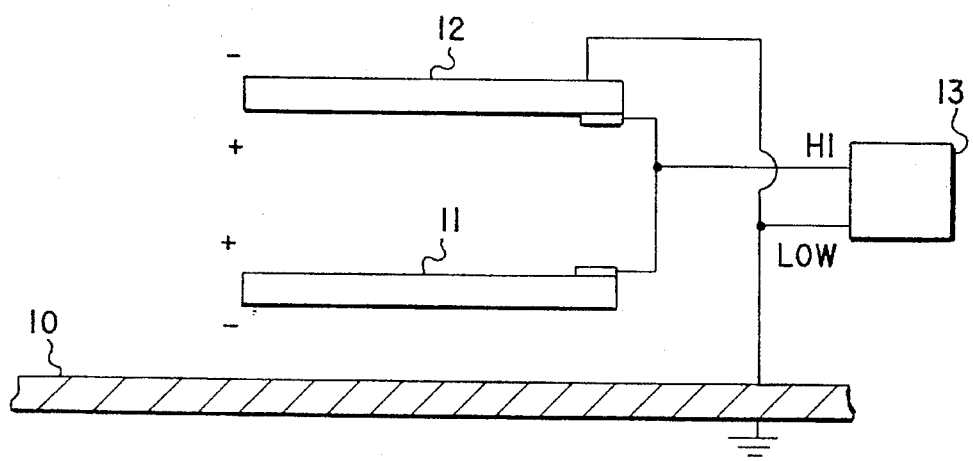
Figure 3:
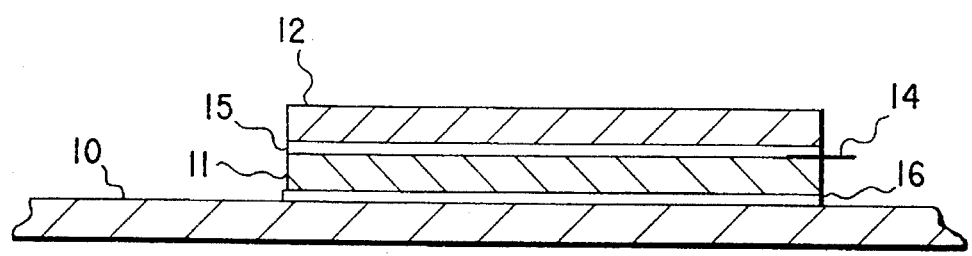

A second piezoceramic, 12, the same size as the first, was then attached on top of the first and wired as shown in FIG. 2 to amplifier 13. The assembled view is shown in FIG. 3. This is essentially a bimorph attached to panel, 10. A modal test was then repeated to determine the resonant frequency for the (1,1) mode for the plate with two patches. It was determined that the (1,1) mode for the plate with two patches was 270 Hz. A 270 Hz, 20.0 volts peak signal was then applied to the piezo. This resulted in an acceleration of 303 m/s$^2$ as measured by a 1.3 gram accelerometer mounted at the center of the plate. Increased actuator output was expected since the effective piezo thickness was increased from about 85% of the optimal thickness. Note that we were able to double the output of the piezo actuator without increasing the voltage from the amplifier. A piezo thickness greater than the optimal thickness results in decreasing the effective moment from the ceramic. Using an even number of layers is a preferred embodiment since it allows the outer-most conductive layers to be grounded which is a safer device. A thin copper foil, 14, is between piezos 11 and 12 which are secured together and to the plate, 10, by adhesive layers 15, 16.

The same acceleration (303 m/s$^2$) could have been achieved with a single-layer piezo patch 0.040 inch thick driven with a 40 volt peak signal. This voltage difference is not significant. However, now suppose the panel were 0.375 inch thick steel, and the desired effective piezo thickness were 0.200 inch thick with 10 volts peak applied for every 0.001 inch of piezo thickness. Then the amplifier voltage requirements would be decreased from 2000 volts peak to 200 volts peak if 10 layers of ceramic (each 0.020 inch thick) were used. This decreases amplifier cost from about $2000 per channel to about $50 per channel. Initially, piezo actuator cost will increase by an order of magnitude to about $400 per actuator, but this is substantially less than the amplifier cost. In addition, it is believed that the price of multi-layer patches can be reduced dramatically if the conductors and ceramic are pressed together and fired as a single unit (as done now for piezo stacks) rather than each layer individually. Sensors such as accelerometers can then be integrated in the manufacture of the multi-layer patch for additional cost savings.

Figure 4:
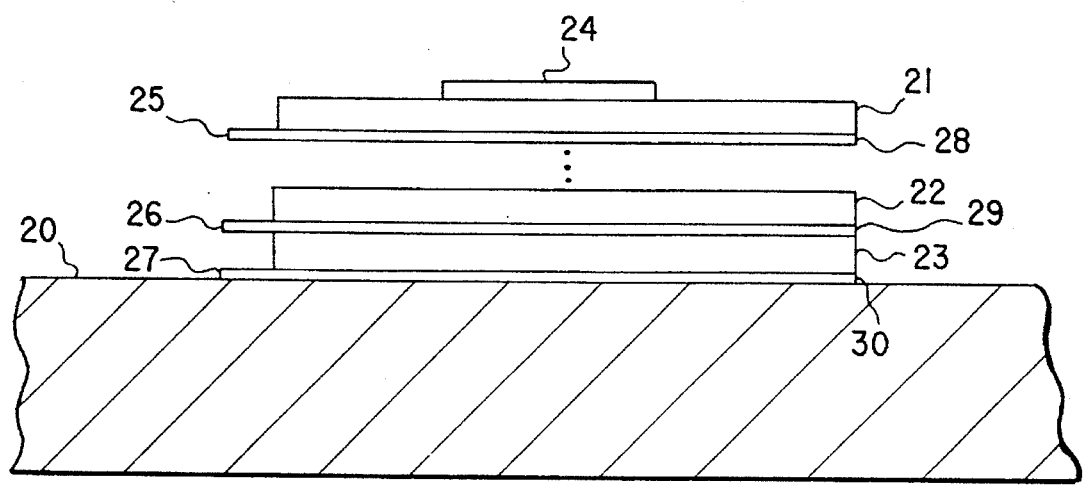

A preferred embodiment of a multi-layer piezo patch is shown in FIG. 4 with piezo layers 21, 22 and 23 secured to plate 20. It is noted that the number of layers should be even. An integral sensor 24 is atop the outer layer 21 and thin conductors 25, 26, and 27 are respectively between layers 21–23.

These multi-layer piezo patches could be used wherever single-layer piezo patches are currently used. This includes one or both sides of panels or enclosures, and even on curved panels (by "precurving" the actuator).

Adhesive layers, 28, 29 and 30 affix the layers to one another and to plate 20.

The use of multi-layer or "multimorph" piezoceramics in the bending mode is not new. Many patents exist for using such devices as electric switches (i.e., relays) or as the drive unit for pumps. However, these are not vibration/acoustic applications. There are cases where bending-mode piezos have been used for vibration/acoustic purposes. For example, several patents exist for the use of one or more layer ceramics as an actuator for cone-type loudspeakers. However, the subject device is for panels or enclosures where loudspeaker type devices are not desirable.

Kumada in U.S. Pat. No. 4,352,961 proposes using a 2-layer transparent piezo (e.g., a bender bimorph) to excite a flat transparent panel speaker. However, his sketch illustrates a piezo thickness greater than the thickness of the panel he is driving. In addition, his sketch illustrates the area of his piezo is nearly as large as the panel he is driving. Thus, the panel he is driving is quite flexible relative to the piezo actuator, similar to the aerospace application discussed in the background above. His device is not suitable for use on thick, rigid panels or enclosures. Furthermore, Kumada refers to the use of piezoelectric "bimorphs" (i.e., a two-layer patch) only. He does not discuss the need for using many layers (as many as 10 or even 100) with thick, rigid panels to decrease voltage requirements. In fact, Kumada uses a transformer in his invention to increase the battery output to the voltage required for the bimorph (3 volts peak), rather than decreasing the voltage requirement by using a multilayer patch.

The utility of the subject device is illustrated in the following test. Three multi-layer bender piezos were attached to the narrow, South end of a power transformer tank. The tank dimensions were approximately 8 ft. wide by 4 ft. deep by 10 ft. tall. The tank was fabricated from ⅜ inch steel. The piezos were then connected to an adaptive controller. At first, accelerometer(s) were placed on the tank for use as the error sensor(s). The controller was able to drive the vibration of the panel to the noise floor of the accelerometer signal, with reductions of 30 to 40 dB.

Next, the accelerometers were replaced with microphones about a meter from the surface of the piezos. The controller was able to drive the sound pressure measured by the microphones to the noise floor of the microphone signal, with reductions of 30 to 40 dB. In addition, the signal from monitor microphones in the far-field (i.e., 30 meters from the South end of the transformer) also decreased by 10 dB. Sound pressure in the far-field on the North end of the transformer also decreased, and sound pressure in the far-field for the East and West sides did not increase. Accelerometer measurements were then taken around the perimeter of the transformer tank at the level of the piezos with control off and on. This measurement showed that vibration levels actually increased on the South side of the tank. Vibration levels on the East side also increased, about 6 dB. The East side vibration was increased to the same level as the West side vibration, such that noise from the two sides canceled in the far-field of the South side.

These test cases illustrate that the multi-layer piezos can be used effectively for vibration control as well as acoustic control. It also illustrates how vibration levels may actually increase for acoustic control with these devices.

Thus the subject device is unique in that it allows structural-acoustic control of thick, rigid panels or enclosures with low cost by decreasing voltage requirements.

While several preferred embodiments of the invention have been shown and described it will be obvious to those of ordinary skill in the art that many changes and modifications can be made without departing from the scope of the appended claims.

I claim:

1. In an enclosure comprising rigid walls having a given thickness and size, the walls being prone to transmit noise from within the enclosure by vibration, the improvement comprising at least one layered piezoelectric means affixed to the approximate center of the half-structural wavelength to be controlled for one said wall, the piezoelectric means being adapted to be activated to vibrate to effectively cancel the vibration of said wall thereby preventing it from transmitting noise, the thickness of each said layer being thin in relation to the thickness of said walls and the area of each said layer being small in relation to the area of said wall, so as to form an optimal piezo thickness to effectively cancel wall vibration at a low voltage.

2. As in claim 1 wherein the thickness of the piezoelectric means as related to said wall is on the order of 1 to 4.

3. As in claim 2 wherein the walls of said enclosure are aluminum.

4. As in claim 1 wherein the thickness of the piezoelectric means as related to said wall is on the order of 1 to 2.

5. As in claim 4 wherein the walls of said enclosure are steel.

6. As in claim 1 wherein said enclosure walls are constructed of a material more flexible than aluminum.

7. As in claim 6 wherein the thickness of the piezoelectric means to said walls is on the order of greater than 1 to 5.

8. In an enclosure comprising walls having a given thickness and size, said walls adapted to transmit noise generated within said enclosure to outside said enclosure, the improvement comprising at least one layered bender piezoelectric means affixed to at least one of said walls, said piezoelectric means being adapted to be activated to vibrate by the application of relatively low voltage so as to effectively cancel the vibration of said wall thereby preventing it from transmitting noise, the thickness of each said layer being thin in relation to the thickness of said walls and the size of each layer being small in relation to the size of said wall, thereby forming an optimal piezo thickness to effectively cancel wall vibration at low voltage.

9. The combination of claim 8 wherein each layer of said piezoelectric means is the same approximate area.

10. The combination of claim 8 wherein there are at least two said piezoelectric means on respective walls of said enclosure.

11. The combination of claim 10 and including controller means adapted to drive said piezoelectric means to thereby cancel said noise.

12. The combination of claim 11 in which each layer is oppositely poled so as to eliminate the need for insulators between said layers.

13. The combination of claim 11 and including a sensor atop said peizoelectric means, said sensor adapted to produce a signal indicative of said vibration to said controller means.

* * * * *